(12) United States Patent
Huang et al.

(10) Patent No.: US 7,453,149 B2
(45) Date of Patent: Nov. 18, 2008

(54) COMPOSITE BARRIER LAYER

(75) Inventors: Cheng-Lin Huang, Hsinchu (TW);
Ching-Hua Hsieh, Hsinchu (TW);
Hsien-Ming Lee, Changhua (TW);
Shing-Chyang Pan, Jhudong Township, Hsinchu County (TW); Chao-Hsien Peng, Hsinchu (TW); Li-Lin Su, Dongshih Township, Taichung County (TW); Jing-Cheng Lin, Chu Tung Zhen (TW); Shao-Lin Shue, Hsinchu (TW); Mong-Song Liang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/024,916

(22) Filed: Dec. 28, 2004

(65) Prior Publication Data

US 2006/0027925 A1     Feb. 9, 2006

Related U.S. Application Data

(60) Provisional application No. 60/598,670, filed on Aug. 4, 2004.

(51) Int. Cl.
*H01L 23/48*    (2006.01)
(52) U.S. Cl. .................... 257/751; 438/627
(58) Field of Classification Search .......... 257/751, 257/767, E21.584; 438/626, 627, 643, 653, 438/927
See application file for complete search history.

(56) References Cited

U.S. PATENT DOCUMENTS

| | | | | |
|---|---|---|---|---|
| 5,714,418 A * | 2/1998 | Bai et al. | ........... | 438/627 |
| 5,858,873 A * | 1/1999 | Vitkavage et al. | ........... | 438/626 |
| 5,985,762 A * | 11/1999 | Geffken et al. | ........... | 438/687 |
| 6,054,382 A * | 4/2000 | Hsu et al. | ........... | 438/628 |
| 6,638,810 B2 * | 10/2003 | Bakli et al. | ........... | 438/240 |
| 6,642,539 B2 * | 11/2003 | Ramesh et al. | ........... | 257/43 |
| 6,797,608 B1 * | 9/2004 | Lin | ........... | 438/627 |
| 6,884,466 B2 * | 4/2005 | Kaloyeros et al. | ........... | 427/255.392 |
| 6,902,763 B1 * | 6/2005 | Elers et al. | ........... | 427/250 |
| 6,905,959 B1 * | 6/2005 | Ashtiani et al. | ........... | 438/648 |
| 6,974,768 B1 * | 12/2005 | Kailasam | ........... | 438/625 |
| 2002/0117700 A1 * | 8/2002 | Fox | ........... | 257/295 |
| 2004/0009615 A1 * | 1/2004 | Schuele et al. | ........... | 438/3 |
| 2004/0247949 A1 * | 12/2004 | Akedo et al. | ........... | 428/704 |
| 2005/0104216 A1 * | 5/2005 | Cabral et al. | ........... | 257/758 |

\* cited by examiner

*Primary Examiner*—Thao X. Le
*Assistant Examiner*—Ajay K Arora
(74) *Attorney, Agent, or Firm*—Duane Morris LLP (57) ABSTRACT

A composite barrier layer provides superior barrier qualities and superior adhesion properties to both dielectric materials and conductive materials as the composite barrier layer extends throughout the semiconductor device. The composite barrier layer may be formed in regions where it is disposed between two conductive layers and in regions where it is disposed between a conductive layer and a dielectric material. The composite barrier layer may consist of various pluralities of layers and the arrangement of layers that form the composite barrier layer may differ as the barrier layer extends throughout different sections of the device. Amorphous layers of the composite barrier layer are generally disposed to form boundaries with dielectric materials and crystalline layers are generally disposed to form boundaries with conductive materials such as interconnect materials.

15 Claims, 10 Drawing Sheets

COMPOSITE BARRIER LAYER

RELATED APPLICATION

This application is related to, and claims priority from U.S. provisional patent application Ser. No. 60/598,670, filed Aug. 4, 2004.

FIELD OF THE INVENTION

The invention relates, most generally, to semiconductor devices and methods for forming the same. More particularly, the invention is directed to a barrier layer used in semiconductor devices.

BACKGROUND OF THE INVENTION

Barrier layers are commonly used between conductive layers in all kinds of semiconductor devices. Barrier layers can prevent spiking between conductive layers, prevent electromigration failures and generally improve the contact between one conductor and another. Barrier layers are particularly useful and critical in high speed, highly integrated semiconductor devices that use copper as the interconnect material. The conductive interconnect materials of a semiconductor device contact each other through openings formed in insulative dielectric materials that otherwise insulate the various conductive interconnect layers from one another in non-contact regions. The majority of any conductive interconnect feature is therefore bounded by a dielectric, i.e., it forms an interface with the dielectric. When a barrier layer is used in conjunction with a conductive interconnect, it is formed either above or below (or both) the conductive interconnect layer and therefore forms an interface with the insulating dielectric in many areas, as well as an interface with another conductor in the critical contact area. A single barrier layer is therefore disposed between conductors in one area and between one of the conductors and a dielectric, in another area. For example, in single damascene or dual damascene technology, the barrier layer may be formed below the conductor that fills the damascene opening. The barrier layer therefore lines the sides of the opening, interfacing with a dielectric, and is also disposed between two conductors at the bottom of the opening where contact is made to a subjacent conductive material.

Conventional barrier layers typically have strengths and shortcomings. For example, some barrier layers adhere well to conductive materials but do not adhere well to dielectric materials. Conversely, other barrier materials adhere well to dielectric materials but do not adhere well to conductive materials. Some barrier materials provide good barrier qualities with respect to some metals, but not others. In general, barrier layers may include superior or poor qualities with respect to electromigration suppression, contact resistance, wettability, step coverage, resistivity, and so on, depending on where they are used. The reason that a conventional barrier layer typically includes shortcomings in addition to desirable qualities is because conventional barrier layers are typically formed of one barrier material that may provide desirable barrier qualities with respect to some materials but not others. No one barrier material is perfect. For example, if the one barrier material provides superior adhesion to conductive layers, it may conversely provide poor adhesion qualities with respect to dielectric layers. While such an exemplary barrier layer may be a superior barrier material between conductive features, it would likely be deficient when disposed between the conductive material and a dielectric.

It would therefore be desirable to provide a barrier layer, such as a composite barrier layer, having superior qualities for its chosen application. For example, it would be desirable to provide a barrier layer that provides superior barrier qualities and adheres well to all materials it interfaces with throughout the semiconductor device. This invention is directed to such a composite barrier layer.

SUMMARY OF THE INVENTION

To achieve these and other objects, and in view of its purposes, an aspect of the invention provides a barrier layer disposed between a conductive layer and a further conductive layer in a semiconductor device, the barrier layer comprising a composite structure having a plurality of layers including a crystalline layer and an amorphous layer.

According to another aspect of the invention, provided is a barrier layer disposed between a conductive layer and a dielectric layer in a semiconductor device, the barrier layer comprising a composite structure having a plurality of layers including a crystalline layer and an amorphous layer. In one embodiment, the amorphous layer forms a boundary with the dielectric layer and the crystalline layer with the conductive layer.

According to another aspect of the invention, provided is a barrier layer formed within a semiconductor device. The barrier layer includes at least two sections, including a first section disposed between a first conductive layer and a second conductive layer and a second portion disposed between the first conductive layer and a dielectric layer. The first section includes a crystalline layer forming a boundary with the first conductive layer, a further crystalline layer forming a boundary with the second conductive layer and a first amorphous layer disposed therebetween. The second section includes the crystalline layer forming a boundary with the first conductive layer and either the first amorphous layer or a second amorphous layer forming a boundary with the dielectric layer.

In another aspect of the invention, provided is a semiconductor device comprising a dielectric portion, a conductive portion and a composite barrier layer interposed between the dielectric portion and the conductive portion. The composite barrier layer includes a tantalum crystalline layer forming a boundary with the conductive portion and an amorphous tantalum nitride layer forming a boundary with the dielectric portion.

In still another aspect of the invention, provided is a method for forming a semiconductor device. The method includes forming a dielectric structure and forming a conductive structure. The method also includes forming a composite barrier layer between the dielectric layer and the conductive structure, the composite barrier layer being comprised of a plurality of layers including a crystalline layer forming a boundary with one of the dielectric structure and the conductive structure, and an amorphous layer forming a boundary with the other of the dielectric structure and the conductive structure.

According to an another aspect of the invention, provided is a semiconductor device comprising a dielectric portion, a conductive portion and a composite barrier layer interposed between the dielectric portion and the conductive portion. The composite barrier layer comprises a layer of a first crystalline material forming a boundary with the conductive portion and a layer of a different crystalline material forming a boundary with the dielectric portion.

According to an another aspect of the invention, provided is a semiconductor device comprising a dielectric portion, a conductive portion and a composite barrier layer interposed between the dielectric portion and the conductive portion. The composite barrier layer comprises a layer of a first amorphous material forming a boundary with the conductive portion and a layer of a different amorphous material forming a boundary with the dielectric portion.

According to an another aspect of the invention, provided is a semiconductor device comprising a barrier layer with at least two sections including a first section disposed between a first conductive material and a second conductive material and a second section disposed between the first conductive material and a dielectric layer. The first section includes a layer of a first crystalline material forming a boundary with the first conductive material and a further layer of the first crystalline material forming a boundary with the second conductive material. The second section includes the layer of the first crystalline material forming a boundary with the first conductive material and a layer of a different crystalline material forming a boundary with the dielectric layer.

According to yet an another aspect of the invention, provided is a semiconductor device comprising a barrier layer with at least two sections including a first section disposed between a first conductive material and a second conductive material and a second section disposed between the first conductive material and a dielectric layer. The first section includes a layer of a first amorphous material forming a boundary with the first conductive material and a further layer of the first amorphous material forming a boundary with the second conductive material. The second section includes the layer of the first amorphous material forming a boundary with the first conductive material and a layer of a different amorphous material forming a boundary with the dielectric layer.

According to yet an another aspect of the invention, provided is a method for forming a semiconductor device. The method includes forming a dielectric structure, forming a conductive structure, and forming a composite barrier layer between the dielectric structure and the conductive structure. The composite barrier layer comprises a plurality of layers including a layer of a first material forming a boundary with the dielectric structure and a layer of a different material forming a boundary with the conductive structure. The first material and the different material are each a crystalline material or each an amorphous material.

BRIEF DESCRIPTION OF THE DRAWING

The invention is best understood from the following detailed description when read in conjunction of the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing. Included are the following figures.

DETAILED DESCRIPTION

In one aspect, the invention provides a composite barrier layer with a crystalline portion and an amorphous portion. The crystalline portion has an ordered microstructure range area of greater than 200 angstroms based on HRTEM analysis. The "amorphous" portion is devoid of long-range crystalline periodic structure. Amorphous is used hereinafter to designate a completely non-crystalline structure or a structure that has nanocrystalline portions that include an ordered microstructure range area of less than 200 angstroms based on HRTEM analysis. Alternatively stated, amorphous designates any structure that does not qualify as crystalline. The barrier layer of the invention is a composite structure formed of at least a duality of layers and advantageously includes different sections in which different combinations of layers combine to formed the composite barrier layer. The barrier layer of the invention finds application in various technologies and may be used between various conductive materials such as copper, and with various dielectric materials. In an exemplary embodiment, the layers that combine to form a composite barrier layer used with copper, are chosen to provide a composite barrier layer that is a superior diffusion barrier, provides good adhesion at the interfaces it forms with both copper and the dielectric, serves as a superior wetting layer that minimizes copper agglomeration, provides acceptable resistivity, good step coverage, low stress and has a preferred texture that enhances copper growth.

Figure 1:
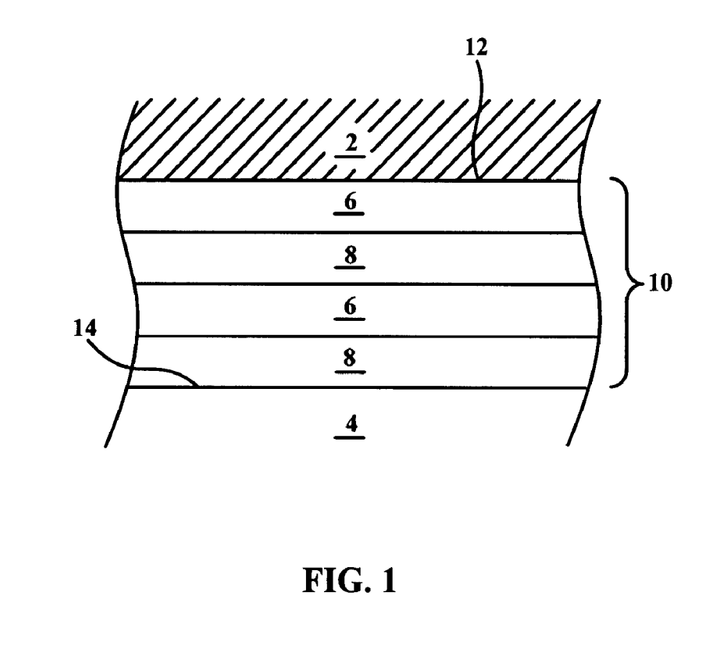
FIGS. 1-5 are each cross-sectional views showing a portion of an exemplary composite barrier layer disposed between two materials according to the invention.

Now referring to the figures, FIG. 1 is a cross-sectional view showing an exemplary barrier layer of the invention. FIG. 1 shows a small portion of an exemplary composite barrier layer of the invention in a region in which the barrier layer is disposed between conductive material 2 and dielectric 4. Barrier layer 10 includes a plurality of layers and in the illustrated embodiment includes two crystalline layers 6 and two amorphous layers 8. Conductive layer 2 may be copper in one exemplary embodiment but in other exemplary embodiments, conductive layer 2 may be tungsten, W, cobalt, Co, nickel, Ni, aluminum, Al, or even silicon, Si. Dielectric 4 may be any of various suitable dielectric materials such as doped or undoped silicon dioxide, SiO, silicon oxynitride, $SiO_xN_y$, silicon nitride, SiN, combinations thereof, or various low-k dielectric materials. Crystalline layers 6 may be formed of tantalum, Ta, titanium, Ti, tungsten, W, Ru, Ruthenium, or various other metals that have crystalline microstructures. Amorphous layers 8 may be tantalum nitride, TaN, titanium nitride, TiN, tungsten nitride, WN, RuN, ruthenium nitride, tantalum oxide, TaO, or various other metal nitrides or metal oxides that are amorphous in nature. Each of amorphous layer 8 and crystalline layer 6 may include the following elements in various combination: Ta, Ti, W, Si, Ru, Zr, N, and O. In the illustrated embodiment, crystalline layer 6 of composite barrier layer 10 forms an interface or boundary 12 with conductive material 2. Amorphous layer 8 of composite barrier layer 10 forms an interface or boundary 14 with dielectric 4. Amorphous layer 8 is chosen to provide superior adhesion qualities to dielectric 4 and crystalline layer 6 provides superior adhesion and wettability qualities to conductive layer 2. In an exemplary embodiment, crystallite layer 6 formed of Ta provides superior adhesion and wettability when conductive layer 2 is copper. TaN is known to provide superior barrier qualities for Cu, so an advantageous composite barrier layer 10 may include Ta as crystalline layer 6 that interfaces with copper, and TaN as one or more of an amorphous layers 8.

Figure 2:
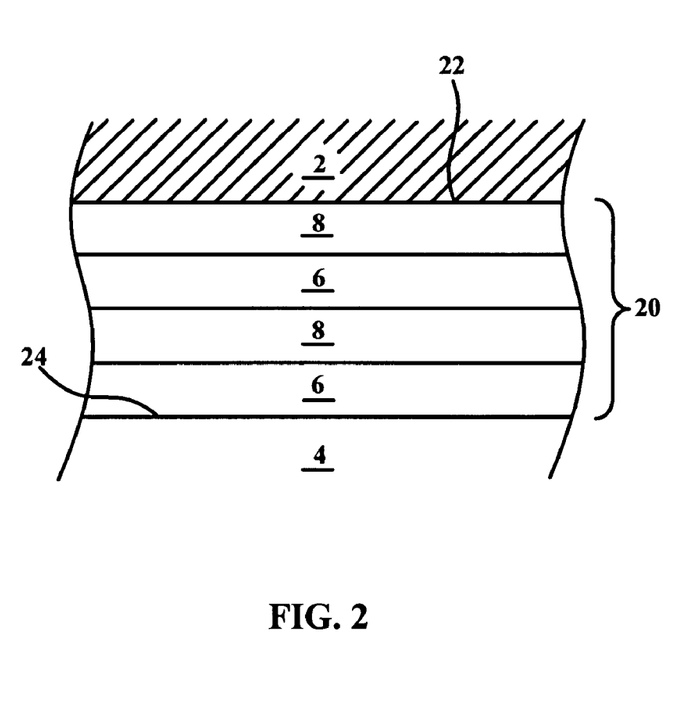

Applicants have also discovered that in some exemplary embodiments, it may be advantageous to form exemplary barrier layer 20 shown in FIG. 2 and in which amorphous layer 8 forms boundary 22 with conductive layer 2 and in which crystalline layer 6 forms boundary 24 with dielectric 4. Barrier layer 20, like barrier layer 10 shown in FIG. 1, includes a plurality of layers, four in particular. In this exemplary embodiment, crystalline layer 6 is formed to have qualities that are compatible with forming a boundary with dielectric layer 4 whereas amorphous layer 8 is chosen to include qualities that are compatible with forming a boundary with conductive layer 2. In particular, amorphous layer 8 is chosen to adhere well to conductive layer 2 and crystalline layer 6 is chosen to adhere well to dielectric 4.

Figure 3:
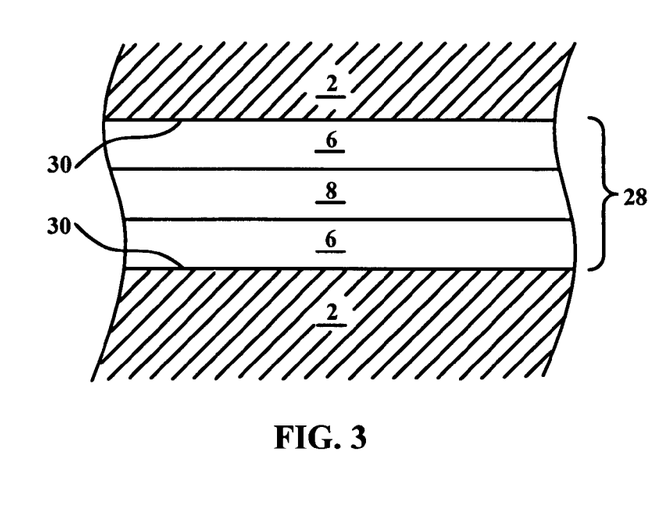

FIG. 3 is a cross-sectional view showing a small portion of exemplary composite barrier layer 28 formed between two conductive layers 2. Either or both of conductive layers 2 may be copper, tungsten, cobalt, nickel, aluminum, or silicon. Composite barrier layer 28 includes two crystalline layers 6, each of which forms boundary 30 with conductive layer 2, and amorphous layer 8 interposed between the conductive layers 6. Composite barrier layer 28 is chosen to provide good barrier qualities and low contact resistance between the two conductive materials 2 and good adhesion at boundaries 30.

Figure 4:
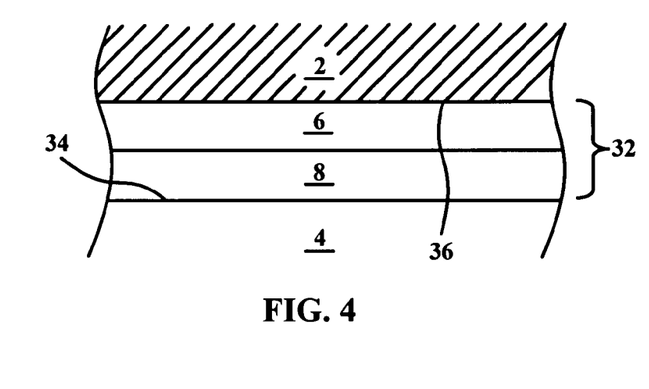
Figure 5:
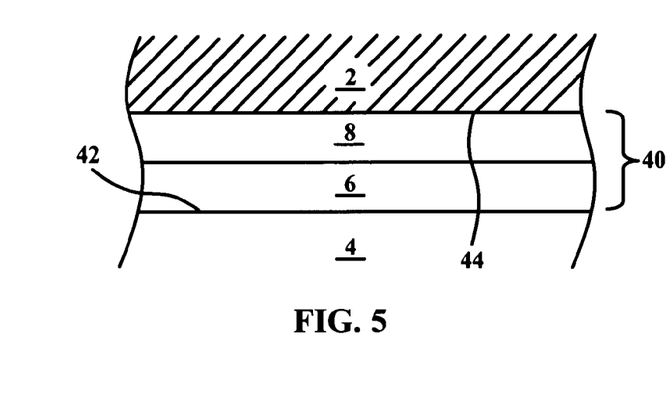

FIG. 4 shows exemplary barrier layer 32 formed between conductive layer 2 and dielectric 4. Barrier layer 32 consists of two layers, conductive layer 6 that forms boundary 36 with conductive layer 2 and amorphous layer 8 that forms boundary 34 with dielectric 4. FIG. 5 illustrates exemplary barrier layer 40 that includes two layers. Crystalline layer 6 forms boundary 42 with dielectric 4 and amorphous layer 8 forms boundary 44 with conductive layer 2.

Figure 6:
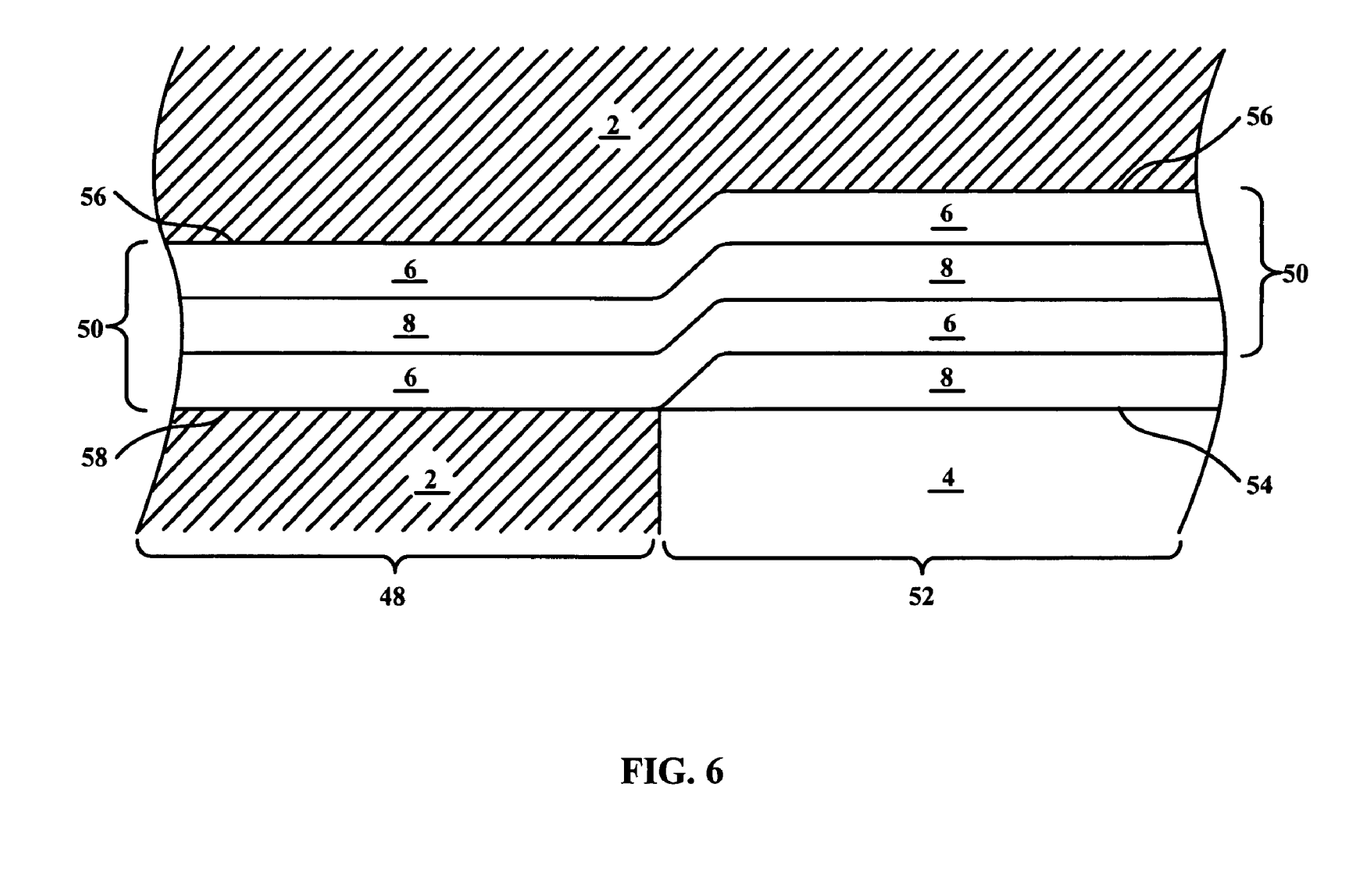
FIGS. 6 and 7 are each cross-sectional views showing a composite barrier layer of the invention that includes multiple sections.

Each of the foregoing exemplary composite barrier layers 10, 20, 28, 32 and 40 include two to four layers and are intended to be exemplary only. In other exemplary embodiments, a greater plurality of layers may be used. In further exemplary embodiments, the composite barrier layer may include different sections formed of different combinations of layers and the composite barrier layer may include sections formed of only one material. The composite barrier layer is always chosen to provide good barrier qualities for the conductive materials it is used in conjunction with The foregoing figures illustrate small portions of a barrier layer to show the various arrangements of amorphous and crystalline layers that combine to form the composite barrier layer in various arrangements between opposed sets of materials. The composite barrier layer of the invention may also include different sections where the barrier layer extends between different sets of opposed materials. For example, FIG. 6 shows composite barrier layer 50 extending through a portion of the semiconductor device in which, at one section 48, composite barrier layer 50 is disposed between two conductive layers 2 and at another section 48 composite barrier layer 50 is disposed between dielectric 4 and conductive layer 2. Composite barrier layer 50 includes three layers in region 48 and four layers in region 52. In region 52, in which the barrier layer 50 is disposed between dielectric 4 and conductive layer 2, barrier layer 50 includes an amorphous layer 8 that forms boundary 56 with dielectric 4 and a crystalline layer 6 that forms boundary 56 with conductive layer 2. In region 48, composite barrier layer 50 includes three layers including amorphous layer 8 disposed between two crystalline layers 6. The upper crystalline layer 6 forms boundary 56 with upper conductive layer 2 and the lower crystalline layer 6 forms boundary 58 with lower conductive layer 2.

Figure 7:
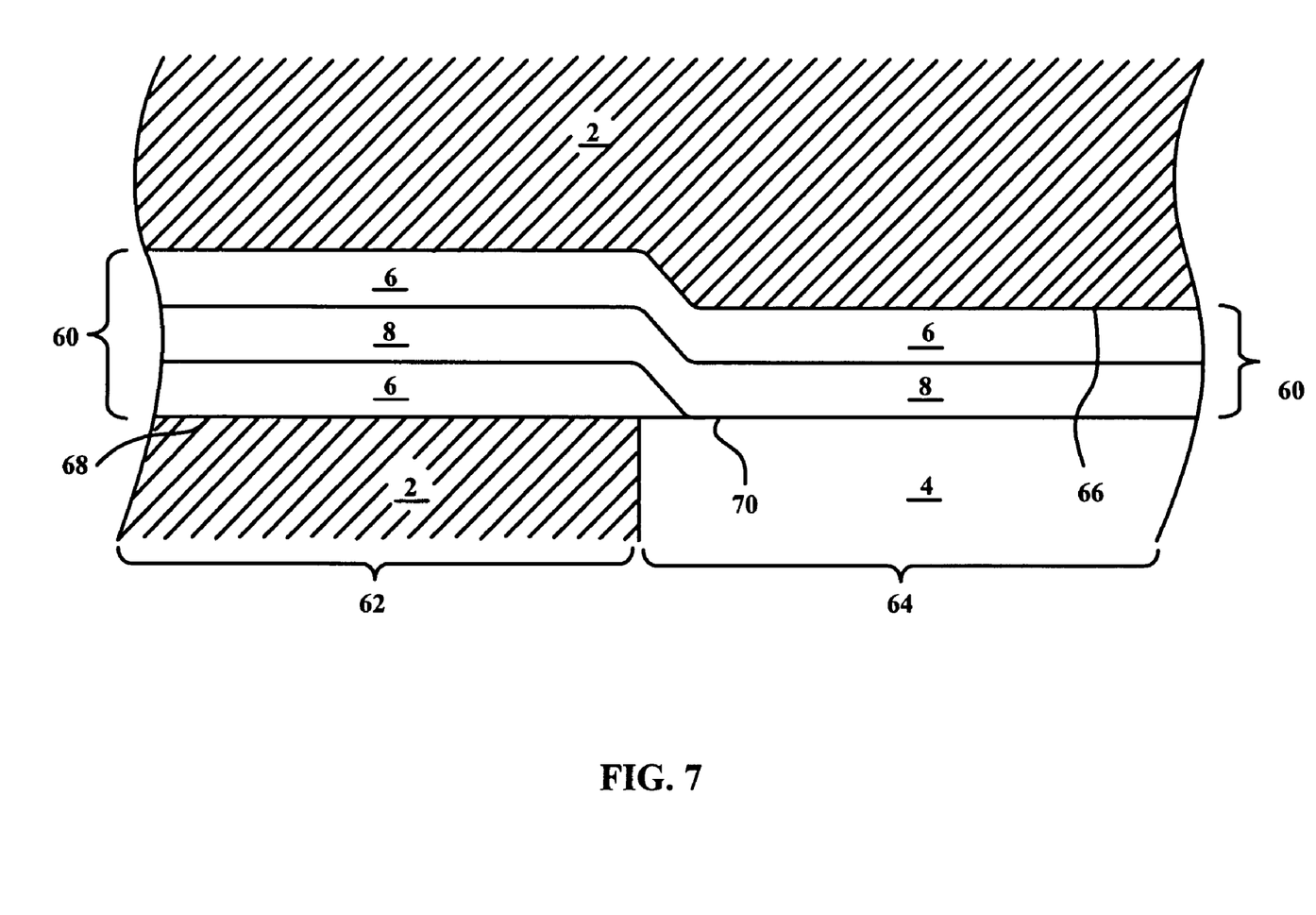

FIG. 7 shows another exemplary barrier layer 60 formed of three layers in region 62 and two layers in region 64. Exemplary barrier layer 60 includes boundary 66 between the upper conductive layer 2 and upper crystalline layer 6. In region 62, exemplary barrier layer 60 also includes boundary 68 between the lower conductive layers 2 and lower crystalline layer 6. Boundary layer 60 further includes boundary 70 between amorphous layer 8 and dielectric 4 in region 64.

The previously illustrated exemplary barrier layers may be used in various technologies that include single damascene, dual damascene or planar contacts and may be applied to various technologies and using the various conventional substrates used to form semiconductor devices such as integrated circuits. The invention also provides a method for sequentially forming the individual layers that combine to form the composite barrier layers. Conventional vapor deposition processes such as PVD, CVD, and ALD may be used.

Figure 8:
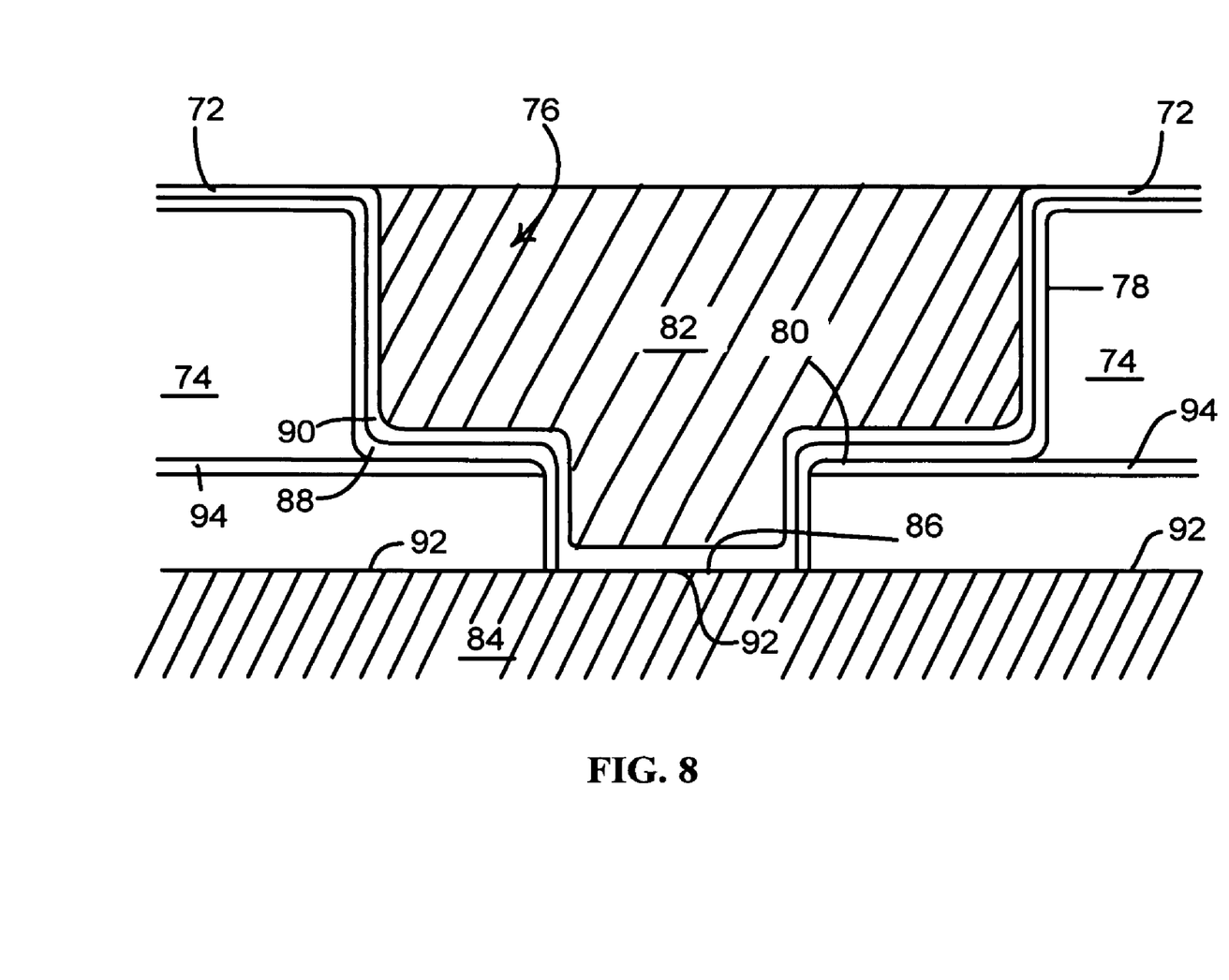
FIG. 8 is a cross-sectional view of an exemplary dual damascene contact structure that includes an exemplary composite barrier layer of the invention.

FIG. 8 shows a lengthier portion of an exemplary composite barrier film of the invention in an application in which composite barrier layer 72 lines a dual damascene opening 76 formed within dielectric 74. Dielectric 74 may consist of a plurality of dielectric layers and may include an etch stop layer disposed between the individual layers such as exemplary etch stop layer 94. Barrier layer 72 extends along sides 78 and terraces 80 of dual damascene opening 76 and is disposed between conductive material 82 formed within dual damascene opening 76 and subjacent conductive layer 84 disposed beneath dual damascene opening 76 and dielectric 74, at contact portion 86. Along sides 78 and terraces 80 of dual damascene opening 76, composite barrier layer 72 includes amorphous layer 90 that interfaces dielectric 74 and crystalline layer 88 that interfaces conductive material 82. The composite barrier layer 72 provides good step coverage and sidewall coverage. At contact portion 86, amorphous 90 is missing and composite barrier layer 72 consists of only a single layer, crystalline layer 88, between conductive materials 82 and 84. In another exemplary embodiment, composite barrier layer 72 may include both crystalline layer 88 and amorphous portion 90 at contact portion 86 and subjacent conductive layer 84 may include a further crystalline barrier layer on its upper surface 92.

The exemplary structure illustrated in FIG. 8 may be formed by first providing dual damascene opening 76 with contact portion 86 that exposes subjacent conductive layer 84. Conventional vapor deposition processes are then used to form amorphous layer 90. As initially formed, amorphous layer 90 may extend along sides 78 and terraces 80 of dual damascene opening 76 as well as over contact portion 86 and subjacent conductive layer 84. In an exemplary embodiment, amorphous layer 90 may be tantalum nitride and after it is formed as described above, an ion milling process may be used to selectively remove amorphous layer 90 from contact portion 86. An argon sputtering process utilizing low pressure, high power and high substrate bias selectively removes amorphous layer 90 from contact portion 86 and back-sputters the removed portion of the film onto sides 78 of dual damascene opening 76. The ion milling operation is designed so that the film removal rate in the field, i.e., over dielectric 74 is lower than the film removal rate at contact portion 86 and the process yields a substantially continuous amorphous layer 90 except for where it is removed from contact portion 86 that forms the bottom of dual damascene opening 76. After the selective removal process is carried out to selectively remove portions of the tantalum nitride film, crystalline layer 88 is formed over the structure before dual damascene opening 76 is filled with conductive material 82. Crystalline layer 88 may be formed using various suitable vapor deposition processes.

Conventional methods may then be used to form conductive material 82. In one embodiment in which conductive material 82 is copper, a copper seed deposition/copper plating sequence may be used.

In another aspect, the composite barrier layer may include two or more crystalline layers of different composition. In yet another aspect, the composite barrier layer may include two or more amorphous layers of different composition. FIGS. 9-14 illustrate various embodiments of the invention including crystalline layer 6, further crystalline layer 6a, amorphous layer 8 and further amorphous layer 8a. Further crystalline layer 6a may be formed of tantalum, Ta, titanium, Ti, tungsten, W, Ru, Ruthenium, or various other metals that have crystalline microstructures. Further amorphous layer 8a may be tantalum nitride, TaN, titanium nitride, TiN, tungsten nitride, WN, RuN, ruthenium nitride, tantalum oxide, TaO, or various other metal nitrides or metal oxides that are amorphous in nature. Each of amorphous layer 8, further amorphous layer 8a crystalline layer 6 and further crystalline layer 6a may include the following elements in various combination: Ta, Ti, W, Si, Ru, Zr, N, and O.

Figure 9:
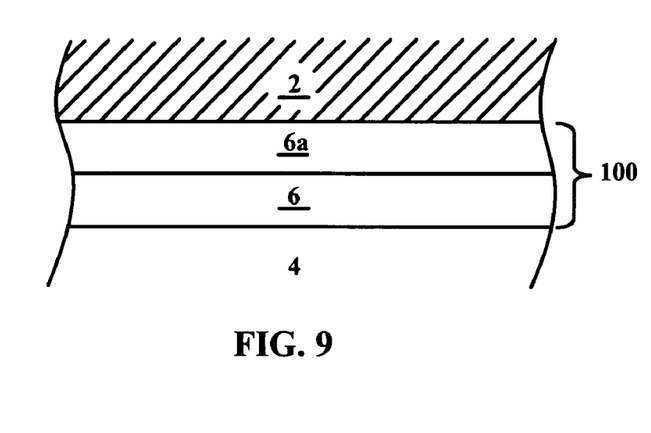
FIGS. 9 and 10 are each cross-sectional views showing a portion of an exemplary composite barrier layer disposed between two materials according to the invention.

FIG. 9, for example, shows composite barrier layer 100 including crystalline layer 6 formed adjacent conductive layer 2 and further crystalline layer 6a formed adjacent dielectric 4. Crystalline layer 6 is advantageously formed of a different material than further crystalline layer 6a. The illustrated embodiment shown in FIG. 9 may include Ta as crystalline layer 6 and Ru as further crystalline layer 6a. In other exemplary embodiments, other crystalline barrier materials may be used and the different crystalline barrier materials are each chosen for their compatibility with the material that they form boundaries with, i.e., conductive layer 2 and dielectric 4.

Figure 10:
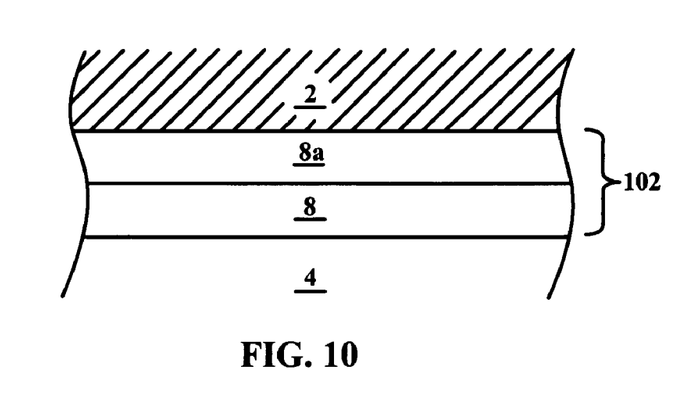

In another embodiment, FIG. 10 shows composite barrier layer 102 including amorphous layer 8 formed adjacent dielectric 4 and further amorphous layer 8a formed adjacent conductive layer 2. Amorphous layer 8 is advantageously formed of a different material than further amorphous layer 8a. The illustrated embodiment shown in FIG. 10 may include TaN as amorphous layer 8 and RuN as further amorphous layer 8a. In other exemplary embodiments, other amorphous barrier materials may be used and the different amorphous barrier materials are each chosen for their compatibility with the material that they form boundaries with, i.e., conductive layer 2 and dielectric 4.

Figure 11:
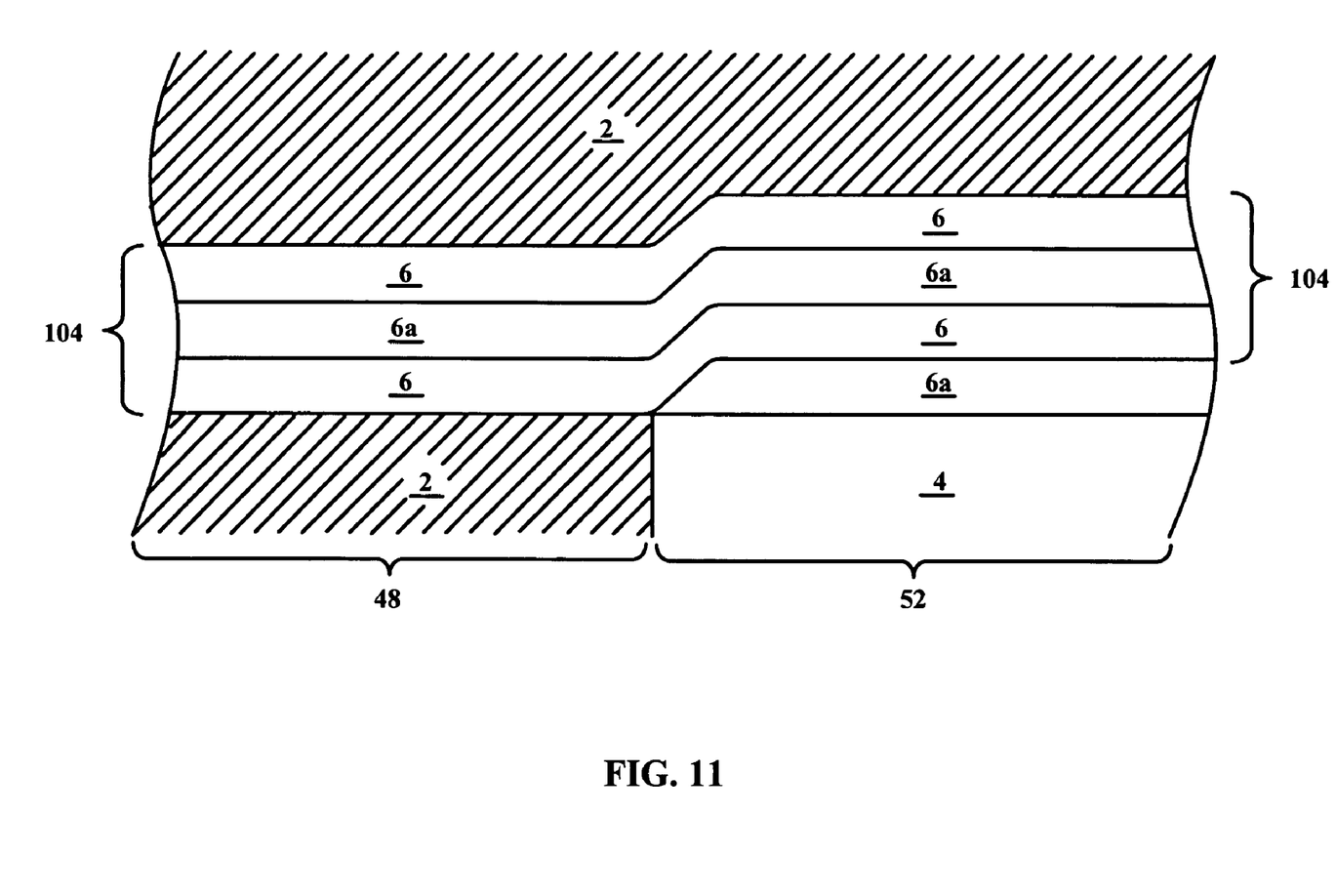
FIGS. 11-14 are each cross-sectional views showing a composite barrier layer of the invention that includes multiple sections.
Figure 12:
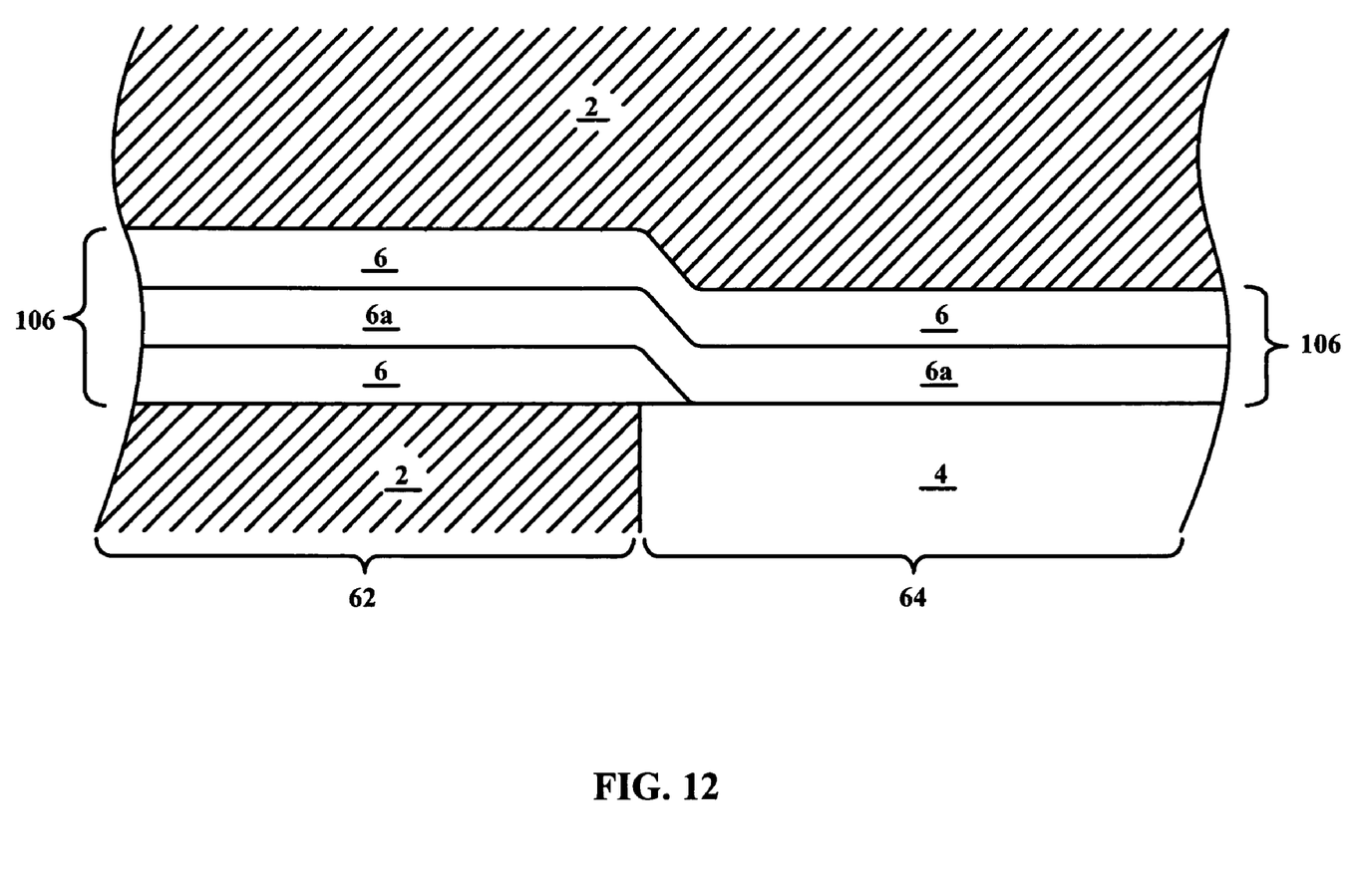
Figure 13:
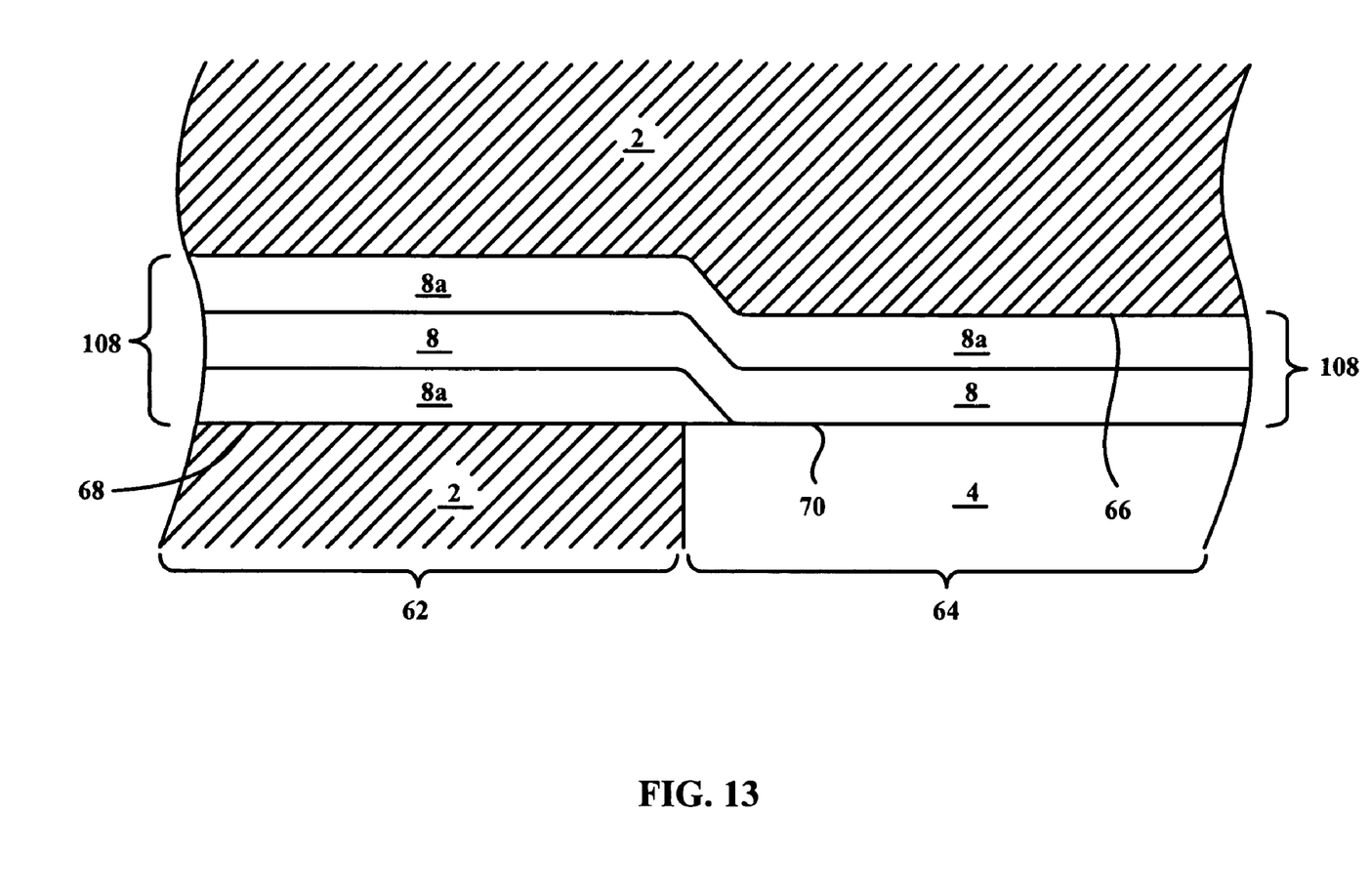
Figure 14:
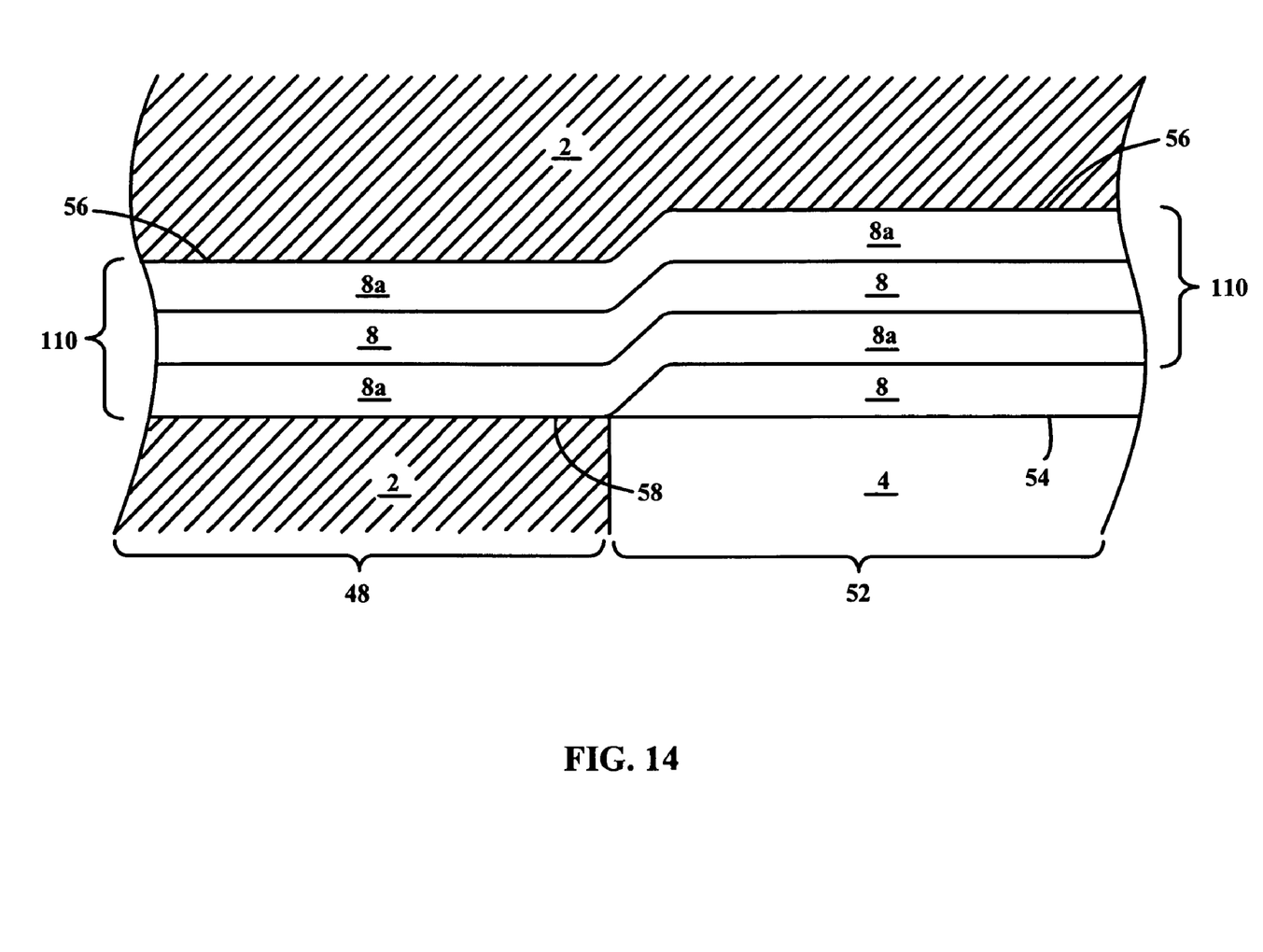

FIGS. 11-14 illustrate various other composite barrier layer embodiments in which like reference numerals refer to like features. Crystalline layers 6 are formed of different materials than further crystalline layers 6a and amorphous layers 8 are formed of different materials than further amorphous layers 8a. Composite barrier layer 104 in FIG. 11 is formed of crystalline layers 6 and further crystalline layers 6a. Composite barrier layer 106 in FIG. 12 is also formed of crystalline layers 6 and further crystalline layers 6a. Composite barrier layer 108 in FIG. 13 is formed of amorphous layers 8 and further amorphous layers 8a. Composite barrier layer 110 in FIG. 14 is also formed of amorphous layers 8 and further amorphous layers 8a.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical,", "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the device be constructed in a particular orientation.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A semiconductor device comprising a barrier layer having multiple portions along its length, each portion formed of a different combination of material layers and including a first portion disposed between a conductive layer and a dielectric layer, said first portion comprising a composite structure having a plurality of layers including a crystalline layer and an amorphous layer, wherein said amorphous layer forms a conterminous boundary with said dielectric layer and said crystalline layer forms a conterminous boundary with said conductive layer, and a second portion that extends between said conductive layer and a conductive portion, said second portion of said barrier layer including said crystalline layer forming said conterminous boundary with said conductive layer and a further crystalline layer forming a conterminous boundary with said conductive portion.

2. The semiconductor device as in claim 1, wherein said conductive layer comprises an interconnect lead, said conductive portion is a portion of a further interconnect lead and said second portion is a contact region.

3. The semiconductor device as in claim 1, wherein said conductive layer and said conductive portion each comprise copper, said amorphous layer is formed of TaN, and said crystalline layer and said further crystalline layer each comprise Ta.

4. The semiconductor device as in claim 1, wherein said conductive layer comprises at least one of copper, tungsten, aluminum, cobalt, nickel, and silicon.

5. The semiconductor device as in claim 1, wherein said amorphous layer includes nanocrystalline portions.

6. The semiconductor device as in claim 1, wherein said amorphous layer comprises at least one of TaN, TiN, WN, and TaO.

7. The semiconductor device as in claim 1, wherein said crystalline layer comprises one of Ta, Ru, Ti, and W.

8. The semiconductor device as in claim 1, wherein said crystalline layer includes at least one element selected from the group consisting of Ta, Ru, Ti, W, Si, Zr, N, and O.

9. The semiconductor device as in claim 1, wherein said plurality of layers comprise said crystalline layer, additional crystalline layers, said amorphous layer and further amorphous layers.

10. A semiconductor device comprising a barrier layer including at least two sections along its length, each section formed of a different combination of material layers and including a first section disposed between a first conductive material and a second conductive material and a second section disposed between said first conductive material and a dielectric layer, said first section including a layer of a first crystalline material forming a conterminous boundary with said first conductive material and a further layer of said first crystalline material forming a conterminous boundary with said second conductive material and said second section having said layer of said first crystalline material forming a conterminous boundary with said first conductive material and an amorphous layer forming a conterminous boundary with said dielectric layer.

11. The semiconductor device as in claim 10, wherein said semiconductor device includes a damascene opening formed in said dielectric layer, said first section is disposed at a bottom of said opening and between said first conductive material disposed within said opening and said second conductive material subjacent said dielectric layer and said opening, and said second portion extends along sides and terraces of said damascene opening.

12. The semiconductor device as in claim 11, wherein said crystalline material comprises tantalum and said amorphous layer comprises tantalum nitride.

13. A semiconductor device comprising a dielectric portion, a conductive portion and a composite barrier layer having multiple portions along its length, each portion formed of a different combination of material layers and including a first portion interposed between said dielectric portion and said conductive portion, said first portion comprising a layer of a first crystalline material forming a conterminous boundary with said conductive portion, and a further layer of said first crystalline material forming a conterminous boundary with said dielectric portion with a layer of a different crystalline material interposed therebetween and a second portion that extends between said conductive portion and a further conductive portion and includes a further layer of said different crystalline material forming a conterminous boundary with said further conductive portion.

14. The semiconductor device as in claim 13, wherein said first crystalline material comprises Ru and said different crystalline material comprises Ta.

15. A semiconductor device comprising a continuous barrier layer having multiple portions along its length, each portion formed of a different combination of material layers and comprising:
   a first portion being a composite structure having a plurality of layers including a crystalline Ta layer and an amorphous TaN layer and extending between a dielectric layer and a conductive cobalt layer, said amorphous TaN layer forming a conterminous boundary with said dielectric layer and said crystalline Ta layer forming a conterminous boundary with said conductive cobalt layer; and
   a second portion that extends between said conductive cobalt layer and a conductive cobalt portion, said second portion being a composite structure having a plurality of layers and laterally contacting said first portion and including said crystalline Ta layer forming said conterminous boundary with said conductive cobalt layer and a further crystalline Ta layer forming a conterminous boundary with said conductive cobalt portion,
   wherein said conductive cobalt layer comprises an interconnect lead and said conductive cobalt portion is a portion of a further interconnect lead and said amorphous TaN layer includes nanocrystalline portions.

* * * * *